United States Patent
Walther et al.

(10) Patent No.: US 6,177,148 B1
(45) Date of Patent: Jan. 23, 2001

(54) PLASMA CVD SYSTEM WITH AN ARRAY OF MICROWAVE PLASMA ELECTRODES AND PLASMA CVD PROCESS

(75) Inventors: Marten Walther, Engelstadt; Wolfgang Möhl, Worms; Burkhard Danielzik, Ingelhelm; Markus Kuhr, Wöllstein; Roland Hochhaus, Mainz; Hartmut Bauch, Weilrod; Martin Heming, Stromberg; Thomas Küpper; Lars Bewig, both of Bad Gandersheim, all of (DE)

(73) Assignee: Carl-Zeiss-Stiftung (DE)

( * ) Notice: Under 35 U.S.C. 154(b), the term of this patent shall be extended for 0 days.

(21) Appl. No.: 09/254,061
(22) PCT Filed: Aug. 23, 1997
(86) PCT No.: PCT/EP97/04605
§ 371 Date: May 10, 1999
§ 102(e) Date: May 10, 1999
(87) PCT Pub. No.: WO98/08998
PCT Pub. Date: Mar. 5, 1998

(30) Foreign Application Priority Data

Aug. 29, 1996 (DE) .............................. 196 34 795

(51) Int. Cl.$^7$ ..................................... H05H 1/46
(52) U.S. Cl. .................. 427/575; 427/571; 118/723 MW
(58) Field of Search ................... 427/575, 569, 427/571; 118/723 MW

(56) References Cited

U.S. PATENT DOCUMENTS 5,017,404 * 5/1991 Paquet et al. ....................... 427/45.1
5,975,014 * 11/1999 Dandl ........................ 118/723 MW

* cited by examiner

Primary Examiner—Shrive Beck
Assistant Examiner—Bret Chen

(57) ABSTRACT

The invention concerns a plasma CVD system (in particular a plasma pulse CVD system) with an array of microwave antennas. According to the invention, in order to improve the homogeneity of the layer, interference is prevented by controlling adjacent antennas in a chronologically offset manner. To that end, microcapsules are provided within the macrocapsules of the plasma pulse CVD process. Additionally, the uniformity of the layer deposition at the interfaces between adjacent modules can be optimized by radio-frequency excitation by means of suitable electrodes, magnetic fields or the configuration of the gas inlets. The surface coated in an operating cycle can thus be scaled as required.

11 Claims, 2 Drawing Sheets

Figure 1:
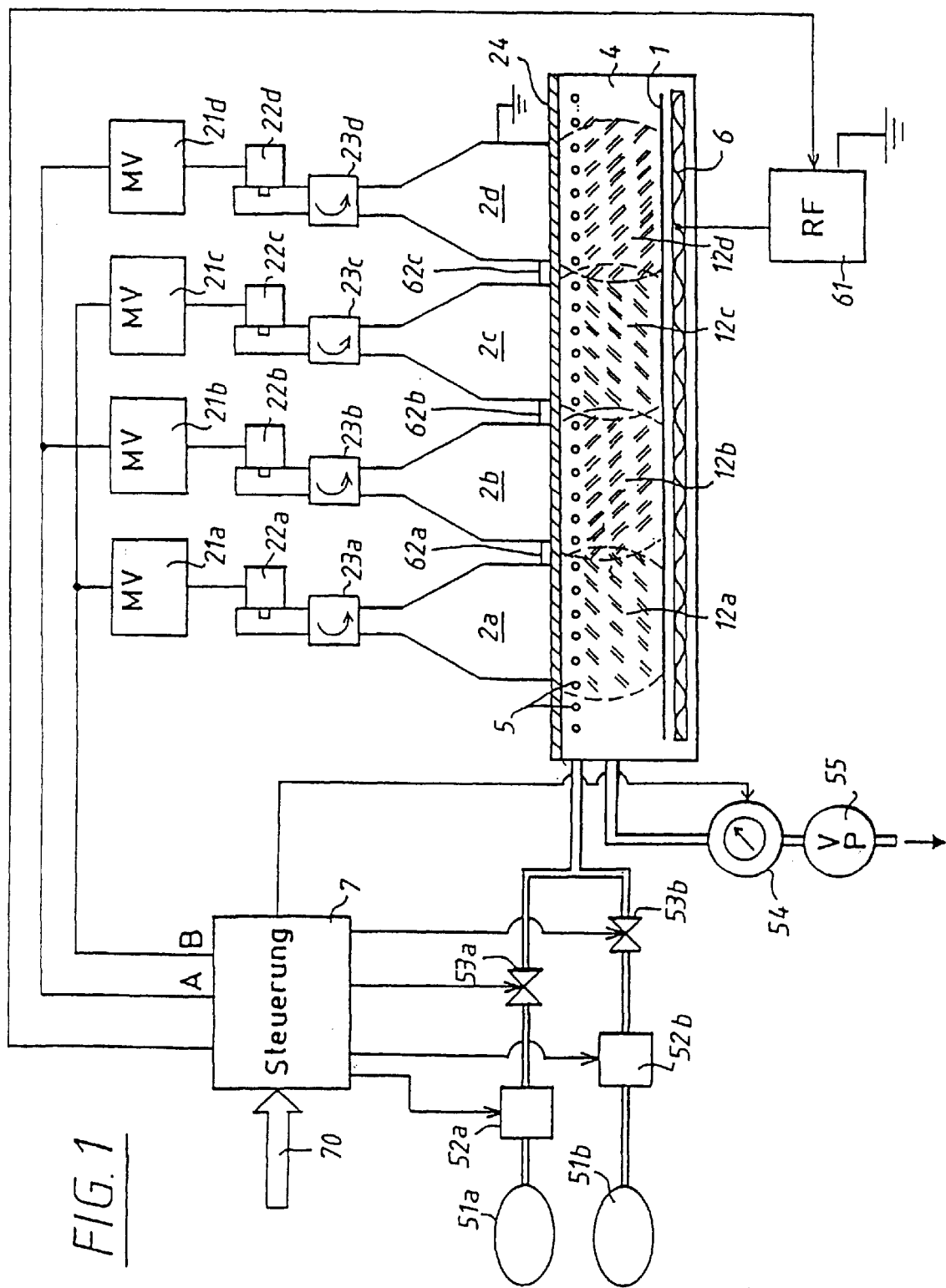

PLASMA CVD SYSTEM WITH AN ARRAY OF MICROWAVE PLASMA ELECTRODES AND PLASMA CVD PROCESS

CROSS REFERENCES TO RELATED APPLICATIONS

Not applicable

STATEMENT REGARDING FEDERALLY SPONSORED RESEARCH OR DEVELOPMENT

Not applicable.

BACKGROUND OF THE INVENTION

1. Field of the Invention

The invention relates to a plasma-supported equipment for chemical gas phase deposition with an array type arrangement of microwave plasma electrodes and a control circuit, and also to a corresponding coating process.

2. Discussion of Related Art

The like is known from U.S. Pat. No. 5,017,404 (DE 38 30 249 C2). It is there provided that the individual plasma electrodes are arranged such that the plasma columns which are produced, overlap. The individual plasma electrodes are switchable and controllable independently of each other by means of the supplied electronic power, and in fact this is used to equalize edge effects or to produce a specific course of the coating properties. It is expressly a prerequisite that disturbing interference effects do not occur with the high frequency fields.

The application to the field of plasma pulse CVD technology is described, as are examples of microwave antennas and the like. The examples relate to two-dimensional arrays.

The said U.S. Pat. No. 5,017,404 is expressly incorporated by reference into the disclosure of this Application. The embodiment of apparatus systems are to be gathered therefrom and are suitable for the suitable control of the plasma electrodes for the embodiment of the invention.

In the case of high requirements on the homogeneity of large-surface layers it has been found that interference of adjacent microwave fields still disadvantageously appears, in contrast to the said document, when there is optimum shaping of the overlap of the plasma columns.

(European Patent) EP 0 420 117 A describes the disturbance due to interference in plasma CVD with excitation by a microwave array, and considers a stable operation to be impossible without their elimination. It is proposed to provide different polarizations, i.e., directions of the electric field vector, in adjacent microwave sources.

However, attaining homogeneous excitation behavior in the individual modules is obviously made more difficult here, since the crossed rectangular waveguides which are shown in the examples do not permit (this) because of the asymmetrical waveguide geometry.

Another kind of interference prevention would be the frequency displacement of adjacent plasma electrodes. Commercial microwave generators have marked frequency fluctuations and also high bandwidths, especially in pulsed operation, so that relatively large frequency differences would be required. However, different plasma-chemical modes of behavior can then no longer be excluded. In addition, microwave generators of optional frequency are not immediately available, since economical operation is only possible for permitted industrial frequencies.

The usual plasma CVD processes are characterized in that the reaction gas flows over the substrate during the whole coating period, and simultaneously energy which produces plasma is introduced into the reaction volume, so that the reaction gas and exhaust gas of an already successful (film-forming, etc.) reaction are either mixed in a manner which is not clearly arranged, or occur in different proportions at different locations of the substrate. The speed of a development, the properties of the coating (especially density, adhesion strength, and stability), and also the yield of reaction gas, are limited.

Such limitations are overcome by the application of the plasma pulse CVD process (PICVD process).

In this process, the energy which generates plasma is introduced in pulsed form, while the reaction gas flows continuously into the reaction space. It is typical for the PICVD process that the interval between pulses is matched to the time required to completely replace with fresh gas the gas volume over the substrate and implicated in the (film-forming) reaction. This time is dependent on several parameters, such as, for example, substrate size and shape, mass flow and temperature of the reaction gas, pressure in the reactor, and kind of gas inflow (e.g., nozzle form).

The process operates like a two-stroke motor; the interval between pulses, in which the used gas is replaced by fresh gas, follows the film-forming plasma pulse.

A further advantage of this process is the low temperature loading of the substrate, since the action of energy on it takes place only during the pulse period, and the substrate cools in the interval between pulses. It is thereby possible, vice versa, to use comparatively high energies during the pulse, and thus to deposit films with properties which otherwise only the solid material has.

The values for the pulse duration are typically between 0.1 and 10 ms, and for the duration of the interval between pulses, between 10 and 100 ms.

It is favorable to irradiate with microwave energy, since plasmas are then produced at gas pressures in the mbar region. Such gas pressures can be produced with comparatively little expense. The PICVD process can be advantageously applied, for example, for the internal coating of dielectric tubes from which, for example, preforms for optical fibers are produced (EP 0 036 191, DE 38 30 622, DE 40 34 211), for the application of IR-transparent dielectric mirrors to glass substrates of spherical surface shape (DE 40 08 405, DE 43 34 572), or for the deposition of planar thin film waveguides on glass or plastic (DE 41 37 606, DE 42 28 853).

SUMMARY OF THE INVENTION

The present invention has as its object the preparation of a plasma CVD system of the kind under consideration, and a corresponding process, wherein optional scalability of the dimensions of the coating unit and outstanding homogeneity of the films produced, with economic construction, are attained.

The object of the invention achieved by a plasma CVD system, comprising: an array of microwave plasma electrode, a switching device, and a control circuit in which the control circuit has two outputs, respective adjacent microwave plasma electrodes are connected to different ones of the two outputs, and the switching device activates the two outputs alternately at different times and for at most 50 microseconds, respectively.

A process for carrying out the invention is achieved by a plasma CVD coating process in which an array of microwave plasma electrodes produces a coherent plasma by pulsed microwave excitation by applying microwave pulses at different times to each two adjacent plasma electrodes, and setting the duration of individual microwave pulses that is short in comparison with the duration of a pulse of a plasma pulse CVD process known per se.

The decoupling with respect to time of the microwave excitation of adjacent plasma electrodes is seen as a further possibility of the prevention of interference. The microwave power can be cycled substantially faster than corresponds to the pulse duration of a plasma pulse CVD process (PICVD) pulse which exhausts the gas supply. Adjacent plasma electrodes can thereby be cycled at staggered times, without resulting in a disturbing effect on the plasma and on the deposition behavior of the PICVD process.

According to an advantageous feature of the invention the pulse duration is at most 50 microseconds, and is thus markedly shorter than the typical time constants of the gas chemistry concerned, of about 100 microseconds.

According to the invention, the simultaneously coated surfaces can be optionally scaled, with a modular system. The knowledge gained with a few modules can be applied to an array with optionally many modules.

According to advantageous features of the invention a few tens of pulses to a few hundred pulses, respectively offset in time for adjacent plasma electrodes, can form a total pulse of the PICVD process.

Advantageous features of the invention give the combination with a radiofrequency (RF) excitation. In connection with the microwave excitation according to the invention, this permits a further increase in uniformity of the films, by suitable control of the field distribution by means of a suitable dimensioning of the spacing and extent of the RF electrodes. The RF excitation can also be pulsed, either synchronously with the microwaves (indeed, for energy saving) or else in another appropriate time sequence.

The combination of microwave and radiofrequency excitation is known per se from Moisan M., Wertheimer M. R., Surface and Coatings Technology 59 (1993), pp. 1–13. The object in that case was the alteration of the film quality by ion bombardment. Here, in contrast, the ease with which the field lines of the RF excitation can be shaped is used in order to improve the homogeneity of the film.

Uniformity can also be increased by the use of magnetic fields to affect the transition region between two plasma electrodes, and also by a suitably structured gas supply.

In particular with a linear array, as is provided according to advantageous features of the invention only two different phase-displaced cycles are required for the interference-free pulsing of all the plasma electrodes, thus effectively limiting the cost of control and of microwave production.

BRIEF DESCRIPTION OF THE INVENTION

The invention will be described in more detail with reference to the accompanying drawings.

Figure 2:
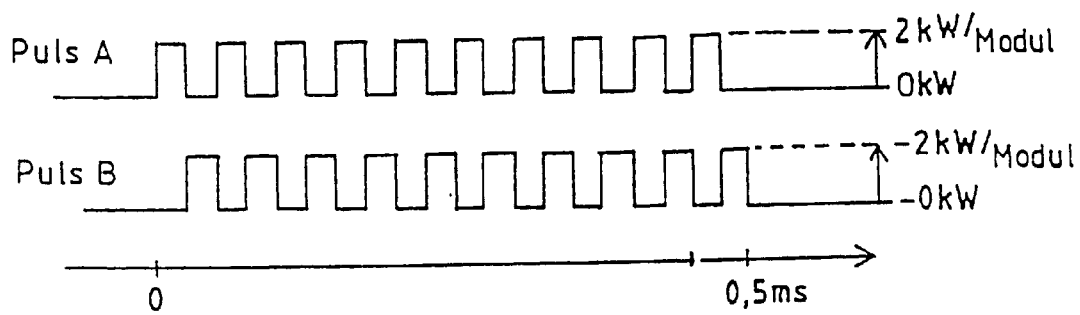
Figure 3:
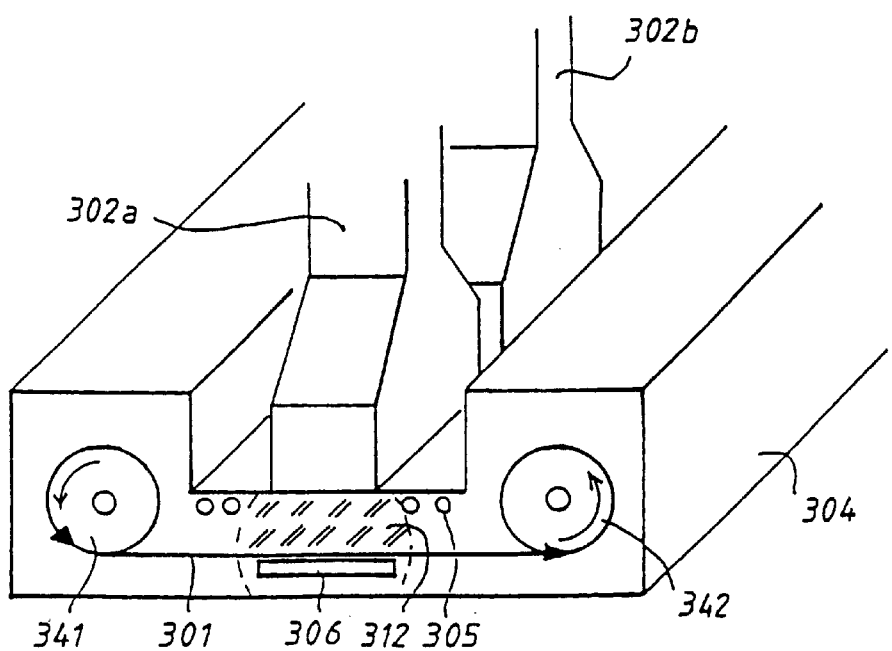

FIG. 1 schematically shows a plasma CVD system;

FIG. 2 schematically shows the time course of the microwave excitation;

FIG. 3 schematically shows a foil coating equipment.

DETAILED DESCRIPTION OF PREFERRED EMBODIMENTS

The plasma CVD system shown in FIG. 1 contains a substrate 1, e.g., a glass plate. Numerous microwave antennas, here four, 2a–2d, are arranged in a row, or else in a flat array, opposite the substrate 1. These horn microwave antennas 2a–2d act as microwave plasma electrodes and are supplied by microwave generators 21a–21d by means of magnetrons 22a–22d and isolators 23a–23d. A microwave window 24, e.g., just like the substrate 1 and also itself ready for coating, closes the vacuum chamber 4 with respect to the microwave antennas 2a–2d. The substrate is arranged opposite and parallel in the vacuum chamber 4.

The process gas is supplied from gas containers 51a, 51b via mass flow regulators 52a, 52b, gas valves 53a, 53b, and the uniformly distributed gas inlets 5 to the vacuum chamber 4, and the used residual gas is sucked out again via a pressure regulator 54 by a vacuum pump 55.

A control 7 suitably sets all these parts corresponding to predetermined parameters, via an interface 70.

So far, the equipment corresponds to the known plasma CVD systems, in particular also PICVD systems and U.S. Pat. No. 5,017,404 (DE 38 30 249 C2).

The special feature is that the microwave generators 21a–21d are separately driven by the control 7 in two groups 21a, 21c and 21b, 21d with signals A or B, and indeed with pulse trains of short micropulses 20A or 20B, which have a push-pull phase displacement. Thus only one of adjacent microwave antennas 2a, 2b; 2b, 2c; 2c, 2d is active at a time, so that interference is excluded. FIG. 2 shows the course of these pulses. The pulse duration and interval of the micropulses A and B together form a pulse of about 0.5 ms duration according to the PICVD process.

The measures of U.S. Pat. No. 5,017,404 can be combined with the invention for the specific setting of the course of film thickness by means of the antenna array.

The resulting plasma zones 12a–12d overlap in their edge regions with decreasing deposition power without interference effects, so that a stable, uniform transition is effected by matching the antenna geometry at the transition regions 62a–62c. The matching of the regions 62a–62d likewise serves for the optimum formation of the RF field.

The number of microwave antennas 2a–2d in a row is a randomly chosen example. The modules, typically covering a few centimeters, of microwave generator 21i, magnetron 22i, isolator 23i and horn antenna 2i (i is from 1 to n), can be arrayed in optional number, e.g., to two or three meters of width for the coating of large flat glass sheets or of lengths of foil.

The following process examples illustrate the process:

PROCESS EXAMPLE 1

The vacuum chamber 4 is first pumped out to well below the desired process pressure. A gas mixture suitable for coating is thereafter produced by means of the mass flow regulators 52a, 52b and also the valves 53a, 53b. For the deposition of $SiO_2$, this mixture can, e.g., consist of 200 sccm (standard cubic centimeters) of oxygen and also 20 sccm of hexamethyl disiloxane (HMDSO). During the whole coating process, these gases flow continuously (not pulsed!). A process pressure of 1 mbar is set by means of the pressure regulator unit 54. As soon as this has been reached, the microwave generators 21a, 21d are driven with the pulse sequence given in FIG. 2.

Each pulse train A, B consists, according to FIG. 2, of 10 individual pulses ("micropulses") of 25 μs duration each and phase displaced in push-pull at the outlet A and B. During the micropulses, the total of which represents a typical PICVD "macro pulse", the coating gas mixture in the plasma space 12a–12d is converted, and diffuses to the substrate 1, on which the desired $SiO_2$ layer is deposited.

After the end of a "macro pulse", the reacted gas mixture is sucked out and is replaced by fresh gas mixture. For a complete gas exchange, the interval between two macro pulses is typically 10–100 ms long (depending on the geometry of the vacuum chamber 4). After the interval between pulses, the micropulse sequence of a macro pulse is again driven, in order to deposit the next film layer, until the reference thickness has been reached. The vacuum chamber 4 is thereafter brought to normal pressure, and the coated substrate 1 can be removed.

PROCESS EXAMPLE 2

The process and its parameters run similarly to those in Example 1, but the substrate this time is a flexible foil 301 which is continuously moved in the coating chamber 304. FIG. 3 shows a cross section of the arrangement with a winding device 341, 342 for the foil 301.

The speed of the foil is adjusted so that each surface element of the foil is coated with the specified film thickness. With typical deposition rates of 500 nm per minute and a specified thickness of 50 nm, the coil 301 must pass through the plasma region 305 in six seconds. It is thereby also insured that the movement of the foil 301 during a micro-pulse is negligible.

PROCESS EXAMPLE 3

The process proceeds as in Example 2, but during a macro pulse, and also a millisecond before and after it, an RF field is turned on. The geometrical structure of the RF electrode 306, with a reduced electrode spacing in the region of the interface of two microwave antennas 302a, 302b, enables the non-uniformities at the interfaces to be compensated. The power of the RF generator can thus be set to optimum film uniformity. In a throughflow equipment, the RF power is subject to feedback control by means of thickness measurement after the coating.

What is claimed is:

1. A plasma CVD system, comprising:
    an array of microwave antennas,
    a switching device, and
    a control circuit,
    in which said control circuit has two outputs of microwave pulses, the respective adjacent microwave antennas are connected to different ones of said two outputs (A, B), and said switching device activates said two outputs (A, B) alternately at different times and for at most 50 microseconds, respectively.

2. The plasma CVD system according to claim 1, further comprising a radiofrequency excitation system.

3. The plasma CVD system according to claim 1, in which said antennas are arranged in a linear array.

4. The plasma CVD system according to claim 3, in which said microwave outputs are applied by said control circuit at the same time to every other microwave antenna in said linear array.

5. A plasma CVD coating process, in which an array of microwave antennas produces a coherent plasma by pulsed microwave excitation, comprising:
    applying microwave pulses at different times to each two adjacent plasma electrodes, and
    setting the duration of individual microwave pulses that is short in comparison with the duration of a pulse of the known plasma pulse CVD process known per se.

6. The plasma CVD process according to claim 5, in which said duration of individual microwave pulses is at most 50 microseconds.

7. The plasma CVD process according to claim 5, in which a value of the order of magnitude of $10^1$ to $10^2$ of microwave pulses of all antennas together forms a pulse of said known plasma pulse CVD process.

8. The plasma CVD process according to claim 5, further comprising producing an electrical field by radiofrequency excitation.

9. The plasma CVD process according to claim 8, further comprising arranging said antennas in a linear array and coating large-surface substrates in a stripwise manner.

10. The plasma CVD process according to claim 9, further comprising delivering microwave pulses at only two different times and alternatingly associating said microwave pulses with said antennas in said linear array.

11. The plasma CVD process according to claim 5, further comprising optimization of uniform layer deposition by application of magnetic fields or by optimization of gas outlets.

* * * * *